US006576865B2

(12) United States Patent
Fukushima et al.

(10) Patent No.: US 6,576,865 B2
(45) Date of Patent: Jun. 10, 2003

(54) LASER TRIMMING PROGRAM GENERATION METHOD

(75) Inventors: Yasuhiko Fukushima, Tokyo (JP); Masakazu Tanaka, Tokyo (JP); Yoshihiro Higashigawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/759,322

(22) Filed: Jan. 16, 2001

(65) Prior Publication Data
US 2002/0023904 A1 Feb. 28, 2002

(30) Foreign Application Priority Data
Aug. 30, 2000 (JP) ........................ 2000-261330

(51) Int. Cl.[7] ................... B23K 26/18; B23K 26/00; G11C 29/00
(52) U.S. Cl. .................. 219/121.69; 219/121.6; 219/121.68; 219/121.67; 219/121.7; 365/189.01; 365/189.08; 365/225.7; 365/200
(58) Field of Search ............. 219/121.6, 121.68, 219/121.69, 121.64, 121.67, 121.7–121.72; 29/712; 711/100; 365/189.01, 189.08, 200, 225.7, 230.01

(56) References Cited

U.S. PATENT DOCUMENTS

| | | | | |
|---|---|---|---|---|
| 4,381,441 A | * | 4/1983 | Desmarais et al. | 219/121.6 |
| 4,418,474 A | * | 12/1983 | Barnett | 29/612 |
| 4,833,621 A | * | 5/1989 | Umatate | 356/401 |
| 4,918,692 A | * | 4/1990 | Hidaka et al. | 714/702 |
| 5,015,989 A | * | 5/1991 | Wohlfarth et al. | 219/121.69 |
| 5,381,137 A | * | 1/1995 | Ghaem et al. | 29/846 |
| 5,568,408 A | * | 10/1996 | Maeda | 700/109 |
| 5,781,021 A | * | 7/1998 | Ilani | 324/754 |
| 5,808,272 A | * | 9/1998 | Sun et al. | 219/121.68 |
| 5,905,681 A | * | 5/1999 | Matsui | 365/189.08 |
| 5,946,210 A | * | 8/1999 | Montminy et al. | 700/103 |
| 5,991,902 A | * | 11/1999 | Yoshida | 711/113 |
| 6,037,799 A | * | 3/2000 | McClure | 326/37 |
| 6,178,125 B1 | * | 1/2001 | Niiro | 365/200 |
| 6,228,666 B1 | * | 5/2001 | Kawano | 257/529 |
| 6,240,033 B1 | * | 5/2001 | Yang et al. | 365/225.7 |
| 6,338,032 B1 | * | 1/2002 | Chen | 327/564 |
| 2002/0035718 A1 | * | 3/2002 | Fukushima et al. | 716/11 |

OTHER PUBLICATIONS

IBM Technical Disclosure Bulletin NN8809228, Quick Scan Position Locator Sytem for Laser Trimmer Systems, Sep. 1, 1988, IBM vol. 31, pp. 228–233.*

* cited by examiner

Primary Examiner—Tom Dunn
Assistant Examiner—L. Edmondson
(74) Attorney, Agent, or Firm—McDermott, Will & Emery

(57) ABSTRACT

An apparatus and method for generating a laser trimming program without causing errors due to development by human hands in a time that does not depend on experiences etc. of a person who generates a program, as well as a recording medium on which a program for execution of such a method is recorded and a laser trimming apparatus using such a program. Fuse coordinate calculation programs are stored in advance in a coordinate calculation program database on a memory core basis and a common portion of an LT program is stored in advance in a common program database. At the time of generating an LT program, type information of a memory core incorporated in a target IC chip is input and a corresponding fuse coordinate calculation program is selected from the fuse coordinate calculation programs stored in the coordinate calculation program database and then loaded. Location-in-IC-chip information and offset information are input, the loaded fuse coordinate calculation program is corrected, and a fuse coordinate calculation program corresponding to the target IC chip is generated. An LT program can be generated by incorporating the fuse coordinate calculation program into a fixed-form program that is supplied from the common program database.

2 Claims, 3 Drawing Sheets

LASER TRIMMING PROGRAM GENERATION METHOD

BACKGROUND OF THE INVENTION

1. Field of the Invention

The present invention relates to a laser trimming program generation apparatus and method, a recording medium, and a laser trimming apparatus. In particular, the invention relates to an apparatus and method for generating a program for laser trimming for cutting fuses corresponding to the address of a defective memory cell of a memory core that is incorporated in an IC chip in replacing the defective memory cell with a redundant memory cell, as well as a recording medium on which a program for execution of such a method is recorded and a laser trimming apparatus using such a laser trimming program.

2. Description of Related Art

In general, as the integration density of a semiconductor memory device increases, the yield that is the ratio of good products in a manufacturing process decreases. Since most of defective products of a semiconductor memory device are discarded, increasing the yield is important for cost reduction. In view of this, semiconductor memory devices are provided in advance with redundant memory cells as a relief measure against occurrence of a defective memory cell. A product having only a slight defect is saved as a completely good product of a memory IC by replacing a block including a defective memory cell with redundant memory cells. A common method for such replacement is to use a laser trimming (LT) apparatus that fuses (cuts) lines called fuses corresponding to the address (hereinafter referred to as "defect address") of a defective memory cell by heating those with laser light.

A defect address is found by an electrical test that is performed in advance by using an IC chip testing apparatus. For defective IC chips that are judged relievable by replacement with redundant memory cells among defective IC chips having a defect address, defect address data or data obtained by coding a defect address are passed to an LT apparatus.

In general, the number of combinations (coordinates) of addresses indicating locations of memory cells is enormous and the number of fuses corresponding to a defect address is extremely large. Therefore, fuse coordinates corresponding to a defect address coordinate are obtained by describing a fuse coordinate calculation algorithm for calculating coordinates of fuses to be cut based on bit data of a defective address in a program for an LT apparatus (hereinafter referred to as "LT program") as a fuse coordinate calculation program.

Since the fuse coordinates and the algorithm for obtaining fuse coordinates (fuse coordinate calculation formula) depends on the semiconductor memory device, the above-mentioned fuse coordinate calculation program is generated for each semiconductor memory device. Further, defect address data or the like are passed to the above-mentioned LT apparatus in the form of a specification. Therefore, a program is developed entirely by human hands. This results in problems that conventionally errors due to development by human hands unavoidably occur at a strong possibility in generating an LT program and that the time necessary for generation of an LT program depends on experiences etc. of a person who generates it.

On the other hand, as for recent development trends of system LSI devices, even more functions have come to be provided in a single device and many devices in which logic and analog functions and a large-capacity memory (e.g., 1 megabits or more) are incorporated in mixture in an LSI chip (hereinafter referred to as "memory-inclusive device") have been developed. In memory-inclusive devices, once developed a memory device portion to be incorporated is put in a library in circuit designing (in the following description, a memory device portion that is put in a library will be called "memory core"). A memory device portion is incorporated in plural kinds of system LSI devices as long as circuit specifications such as an address bus size and a bus size are the same.

In system LSI devices of the above kind, fuse coordinates corresponding to a defect address coordinate can be obtained by using the same fuse coordinate calculation formula for different LSI chips as long as the inside of a memory core is concerned. However, in practice, there is a problem that since fuse coordinates with respect to the coordinate origin of an LSI chip are needed, LT programs need to be corrected manually even in a case of using memory-inclusive devices incorporating the same memory core.

As described above, there are problems that errors due to development by human hands unavoidably occur at a strong possibility in generating a conventional LT program and that the time necessary for generation of a program depends on experiences etc. of a person who generates it. There is another problem that LT programs need to be corrected manually even in a case of using memory-inclusive devices incorporating the same memory core.

SUMMARY OF THE INVENTION

The present invention has been made to solve the above problems in the art, and an object of the invention is therefore to provide an apparatus and method for generating a laser trimming program without causing errors as would otherwise occur unavoidably when a program is developed by human hands in a time that does not depend on experiences etc. of a person who generates a program, as well as a recording medium on which a program for execution of such a method is recorded and a laser trimming apparatus using such a laser trimming program.

According to a first aspect of the present invention, there is provided a laser trimming program generation apparatus comprising: a common program recording section in which an IC-chip-independent common program of a program for laser trimming for cutting fuses corresponding to an address of a defective memory cell of a memory core that is incorporated in an IC chip and used for recording of information in replacing the defective memory cell with a redundant memory cell is recorded; a coordinate calculation program recording section in which fuse coordinate calculation programs for determining coordinates of fuses to be cut are recorded on a memory core basis; parameter input means for inputting memory core location parameters including type information indicating a type of a memory core and location-in-IC-chip information indicating a location of the memory core in an IC chip; selecting means for selecting a fuse coordinate calculation program corresponding to the memory core from the fuse coordinate calculation programs recorded in the coordinate calculation program recording section based on the type information of the memory core that has been input through the parameter input means; fuse coordinate calculation program generating means for generating a fuse coordinate calculation program dependent on the IC chip of a laser trimming program based on the fuse coordinate calculation program corresponding to the memory core that has been selected by the selecting means and the memory core location parameters of the memory core in the IC chip that have been input through the parameter input means; and laser trimming program generating means for generating a laser trimming program by incorporating the fuse coordinate calculation program that has been generated by the fuse coordinate calculation program generating means into the common program recorded in the common program recording section.

According to a second aspect of the present invention, there is provided a laser trimming apparatus which performs laser trimming by using the laser trimming program that is recorded in the laser trimming program recording section as set forth in the present invention of claim 3.

According to a third aspect of the present invention, there is provided a laser trimming program generation method for generating a laser trimming program by using a common program recording section in which an IC-chip-independent common program of a program for laser trimming for cutting fuses corresponding to an address of a defective memory cell of a memory core that is incorporated in an IC chip and used for recording of information in replacing the defective memory cell with a redundant memory cell is recorded, and a coordinate calculation program recording section in which fuse coordinate calculation programs for determining coordinates of fuses to be cut are recorded on a memory core basis, comprising the steps of: a parameter input step of inputting memory core location parameters including type information indicating a type of a memory core and location-in-IC-chip information indicating a location of the memory core in an IC chip; a selecting step of selecting a fuse coordinate calculation program corresponding to the memory core from the fuse coordinate calculation programs recorded in the coordinate calculation program recording section based on the type information of the memory core that has been input in the parameter input step; a fuse coordinate calculation program generating step of generating a fuse coordinate calculation program dependent on the IC chip of a laser trimming program based on the fuse coordinate calculation program corresponding to the memory core that has been selected in the selecting step and the memory core location parameters that have been input in the parameter input step; and a laser trimming program generating step of generating a laser trimming program by incorporating the fuse coordinate calculation program that has been generated in the fuse coordinate calculation program generating step into the common program recorded in the common program recording section.

According to a fourth aspect of the present invention, there is provided a recording medium in which a computer-readable program for execution of the laser trimming program generation method according to the present invention of claim 5 or 6 is recorded.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

Figure 1:
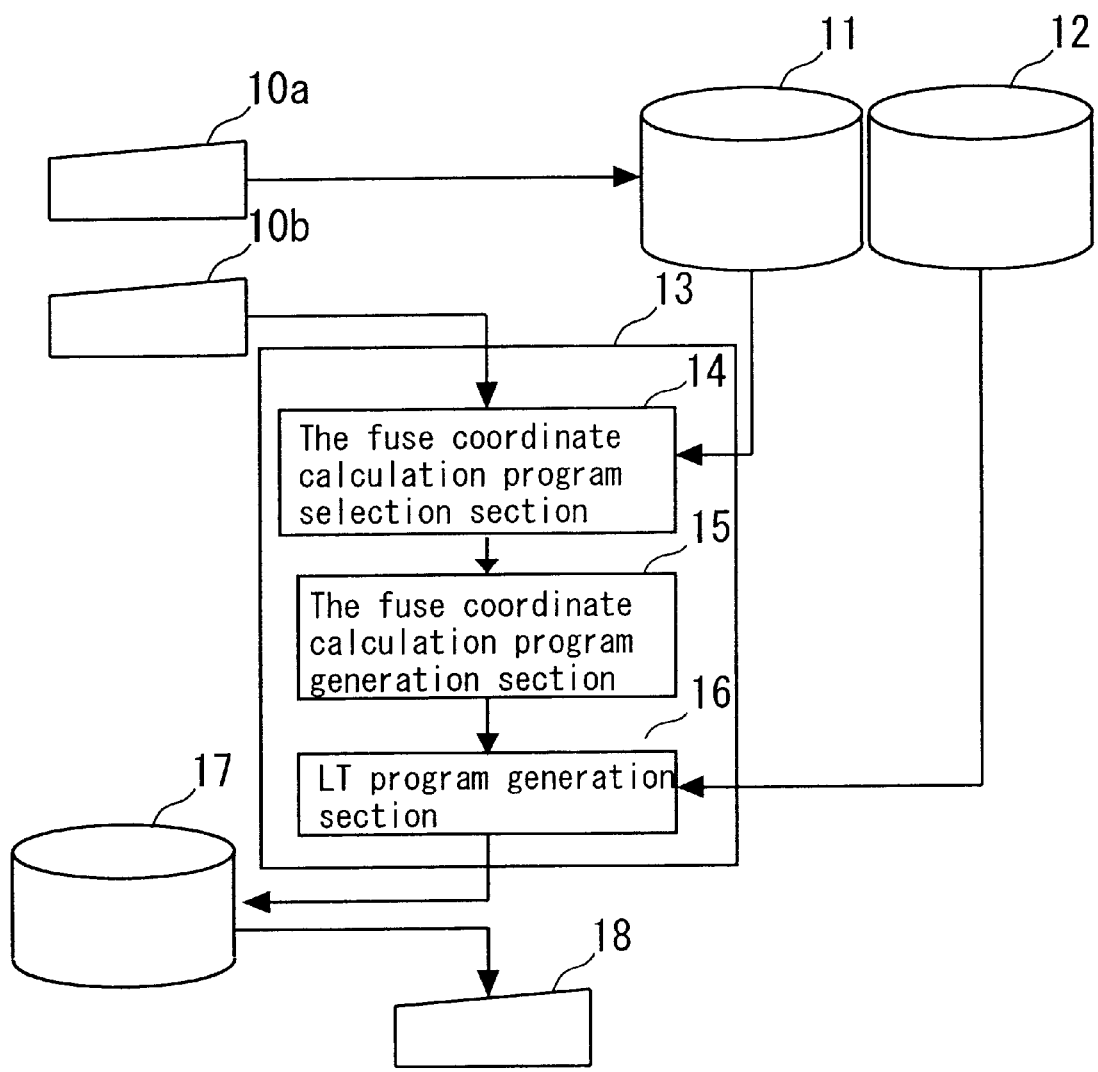
FIG. 1 is a block diagram showing an example LT program generation apparatus according to a first embodiment of the invention.

Embodiments of the present invention will be described below with reference to the accompanying drawings. It is noted that the same reference symbols in the drawings denote the same or corresponding components.

First Embodiment

FIG. 1 is a block diagram showing an example LT program generation apparatus according to a first embodiment of the invention. In FIG. 1, reference symbol 10a denotes an input device for inputting a corresponding fuse coordinate calculation program on a memory core basis every time a coordinate calculation formula of a new memory core is developed and inputting a common program such as an operation procedure of an LT apparatus, independent of the IC or LSI chip (hereinafter referred to simply as "IC chip"), of an LT program. Reference numeral 11 denotes a coordinate calculation program database (coordinate calculation program recording section) in which fuse coordinate calculation programs that are input through the input device 10a are registered and stored as a library so as to be correlated with respective memory cores. Reference numeral 12 denotes a common program recording database (common program recording section) for storing a common program that is input through the input device 10a. Reference symbol 10b denotes an input device (parameter input means) inputting various parameters to be used for generation of an LT program. The input device 10b is connected to an LT program automatic generation section 13 (described later). Examples of the various parameters are memory core location parameters such as type information indicating the type of a memory core and location-in-IC-chip information of a memory core. Each of the input devices 10a and 10b has a display device such as a CRT display, a keyboard, a mouse, etc. In particular, the input device 10b allows input of memory core location parameters in an interactive manner using an ordinary language that is not a programming language. The coordinate calculation program database 11 can store memory core type information (mentioned above) and a corresponding fuse coordinate calculation program in the form of a pair. Reference numeral 17 denotes an LT program database (laser trimming program recording section) for storing a generated LT program. Reference numeral 18 denotes an output device for outputting an LT program stored in the LT program database 17 after converting it into such a medium that can be processed by an LT apparatus (not shown).

The LT program automatic generation section 13 has a fuse coordinate calculation program selection section 14 for selecting a fuse coordinate calculation program corresponding to a memory core, a fuse coordinate calculation program generation section 15, and an LT program generation section 16. The fuse coordinate calculation program selection section 14 (selecting means) selects a fuse coordinate calculation program corresponding to a memory core concerned from the fuse coordinate calculation programs stored in the coordinate calculation program database 11 based on memory core location parameters (memory core type information) that are input through the input device 10b and loads the selected fuse coordinate calculation program into a memory (not shown).

The fuse coordinate calculation program generation section 15 (fuse coordinate calculation program generating means) corrects a fuse coordinate calculation program that is selected and loaded by the fuse coordinate calculation program selection section 14 in a manner suitable for a target IC chip based on location-in-IC-chip information that is input as memory core location parameters through the input device 10b. As a result, a fuse coordinate calculation program corresponding to the target IC chip can be generated.

The LT program generation section 16 (laser trimming program generating means) generates an LT program by incorporating a fuse coordinate calculation program corresponding to a target IC chip that is generated by the fuse coordinate calculation program generation means 15 into a semiconductor-memory-device-independent, fixed-form program that is supplied from the common program database 12. The LT program generated by the LT program generation section 16 is stored in the LT program database 17. The LT program stored in the LT program database 17 is output after being converted by the output device 18 into a medium that can be processed by the LT apparatus (not shown).

Figure 2:
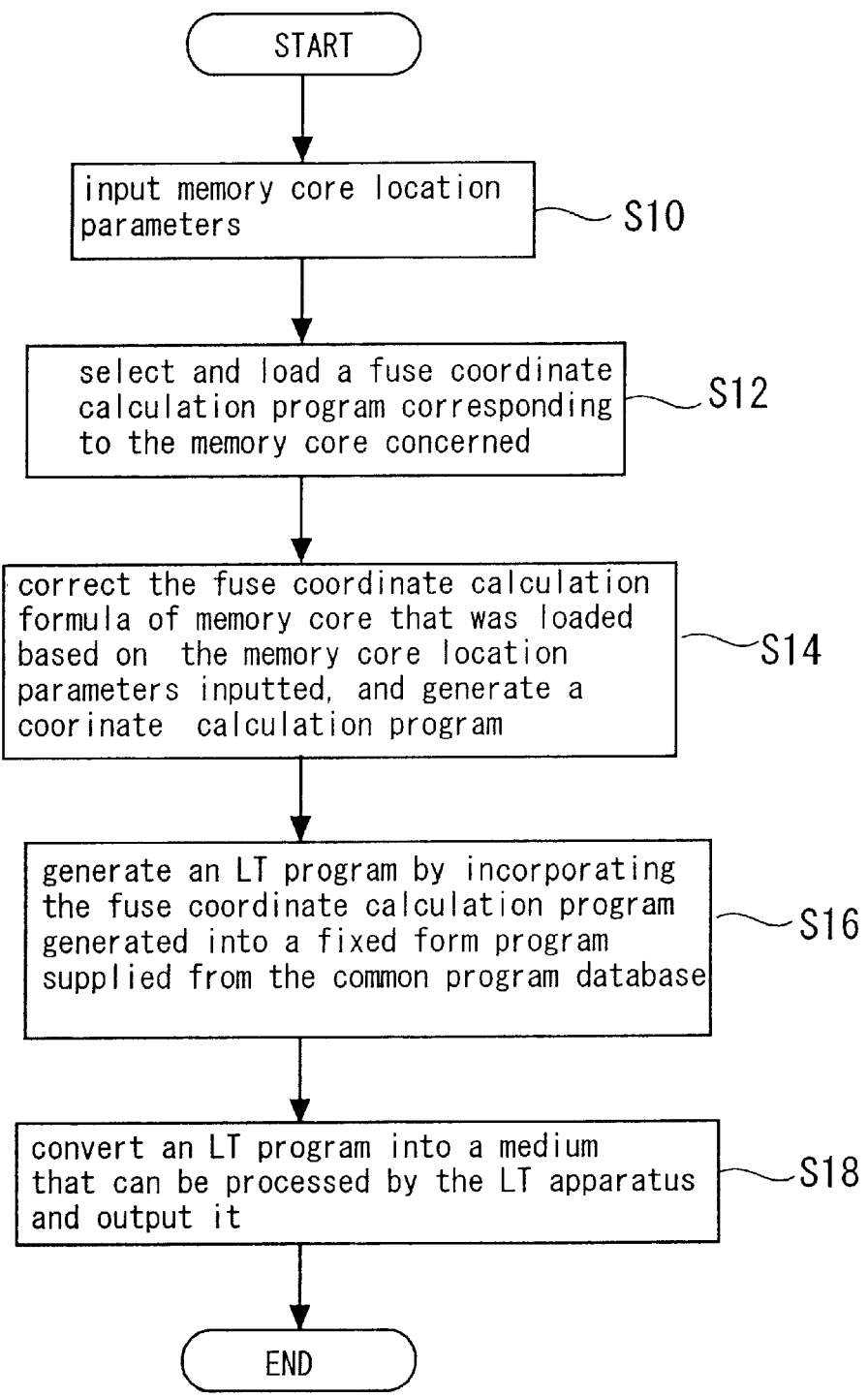
FIG. 2 is a flowchart showing an example LT program generation method according to the first embodiment of the invention.

FIG. 2 is a flowchart showing an example LT program generation method according to the first embodiment of the invention. Although not shown in the flowchart of FIG. 2, a preparatory operation is performed in the above-described manner in which every time a fuse coordinate calculation formula of a new memory core is developed, a corresponding fuse coordinate calculation program is input on a memory core basis through the input device 10a and stored in the coordinate calculation program database 11 in advance. This operation needs to be performed only at the first time when a semiconductor memory device incorporating a new memory core has been developed. Further, an IC-chip-independent, common program of an LT program is input through the input device 10a and stored in the common program database 12 in advance.

At the time of generating an LT program, first, at step S10, memory core location parameters are input through the input device 10b in an interactive manner using an ordinary language that is not a programming language. The memory core location parameters include type information of a memory core that is incorporated in an IC chip, location-in-IC-chip information of the memory core, and offset information indicating an offset between the coordinate origins of the memory core and the IC chip. It goes without saying that the memory core location parameters can include other information.

Next, at step S12, a fuse coordinate calculation program corresponding to the memory core concerned is selected from the fuse coordinate calculation programs stored in the coordinate calculation program database 11 based on the type information of the memory core incorporated in the IC chip that was input at step S10 and the selected fuse coordinate calculation program is loaded into the memory (not shown). If no fuse coordinate calculation program corresponding to the input memory core type information exists in the coordinate calculation program database 11, it is necessary to input a new fuse coordinate calculation program through the input device 10a and register it in the coordinate calculation program database 11.

When a fuse coordinates calculation program corresponding to the input memory core type information exists in the coordinate calculation program database 11, at step S14 the fuse coordinate calculation program (coordinate calculation formula) that was loaded at step S12 is corrected based on the location-in-IC-chip information of the memory core and the offset information indicating the offset between the coordinate origins of the memory core and the IC chip that were input at step S10, whereby a fuse coordinate calculation program corresponding to the target IC chip is generated.

At step S16, an LT program can be generated by incorporating the fuse coordinate calculation program corresponding to the IC chip that was generated at step S14 into a semiconductor-memory-device-independent, fixed-form program that is supplied from the common program database 12.

At step S18, the LT program that was generated at step S16 is stored in the LT program database 17 and then output after being converted by the output device 18 into a medium that can be processed by the LT apparatus (not shown).

Although in the above description the input devices 10a and 10b are separate devices, they may be the same device. Further, although in the above description the coordinate calculation program database 11 and the common program database 12 are databases stored in separate devices, they may be stored in the same device.

As described above, according to the first embodiment, fuse coordinate calculation programs are stored in advance in the coordinate calculation program database 11 on a memory core basis and an IC-chip-independent common program of an LT program is stored in advance in the common program database 12. At the time of generating an LT program, it is possible to input type information of a memory core incorporated in a target IC chip through the input device, select a corresponding fuse coordinate calculation program from the fuse coordinate calculation programs stored in the coordinate calculation program database 11, and load the selected fuse coordinate calculation program. Then, it is possible to input location-in-IC-chip information of the memory core and offset information indicating an offset between the coordinate origins of the memory core and the IC chip, correct the loaded fuse coordinate calculation program, and generate a fuse coordinate calculation program corresponding to the target IC chip. Then, it is possible to generate an LT program by incorporating the fuse coordinate calculation program into a semiconductor-memory-device-independent, fixed-form program that is supplied from the common program database 12. Since an LT program can be generated automatically in the above described manner, there can be provided an apparatus and method for generating, in a case where IC chips incorporating the same memory core are used, a laser trimming program without causing errors as would otherwise occur unavoidably when a program is developed by human hands in a time that does not depend on experiences etc. of a person who generates a program. A recording medium on which a program for execution of the such a method is recorded and a laser trimming apparatus using such a laser trimming program can also be provided.

Second Embodiment

Figure 3:
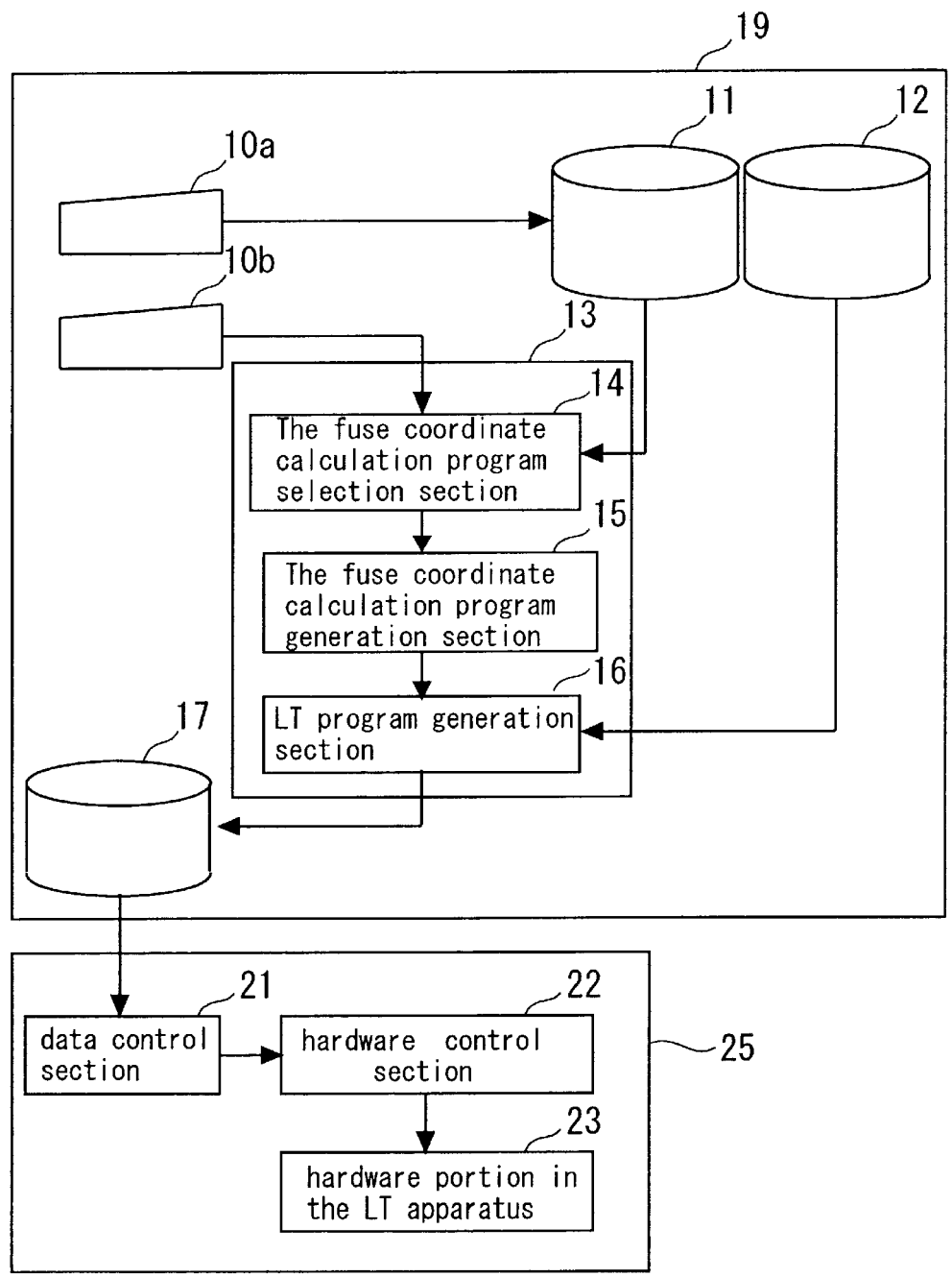
FIG. 3 is a block diagram showing an example LT program generation apparatus according to a second embodiment of the invention.

FIG. 3 is a block diagram showing an example LT program generation apparatus according to a second embodiment of the invention. The components in FIG. 3 that are given the same reference symbols as the corresponding components in FIG. 1 are the same as the latter and hence will not be described. In FIG. 3, reference numeral 19 denotes a portion of the LT program generation apparatus according to the first embodiment excluding the output device 18. Reference numeral 25 denotes an LT apparatus; 23, a hardware portion in the LT apparatus 25; 22, a hardware control section for controlling the operation of the hardware portion 23; and 21, a data control section for controlling the flow of data in the LT apparatus 25.

As shown in FIG. 3, in the second embodiment, in contrast to the first embodiment, an LT program stored in the LT program database 17 can directly be output to the data control section 21 of the LT apparatus 25. As a result, when viewed from the LT apparatus 25, only memory core location parameters etc. are input externally through the input device 10b. And an LT program can be managed within the LT apparatus 25. Therefore, the LT apparatus 25 can dispense with the LT program itself.

As described above, according to the second embodiment, in contrast to the first embodiment, an LT program stored in the LT program database 17 can directly be output to the data control section 21 of the LT apparatus 25. As a result, there can be provided, in addition to the advantages of the first embodiment, an advantage that the LT apparatus 25 can dispense with the LT program itself.

As described above, according to the invention, fuse coordinate calculation programs are stored in advance in the coordinate calculation program database 11 on a memory core basis and an IC-chip-independent common program of an LT program is stored in advance in the common program database 12. At the time of generating an LT program, it is possible to input type information of a memory core incorporated in a target IC chip through the input device, select a corresponding fuse coordinate calculation program from the fuse coordinate calculation programs stored in the coordinate calculation program database 11, and load the selected fuse coordinate calculation program. Then, it is possible to input location-in-IC-chip information of the memory core and offset information indicating an offset between the coordinate origins of the memory core and the IC chip, correct the loaded fuse coordinate calculation program, and generate a fuse coordinate calculation program corresponding to the target IC chip. Then, it is possible to generate an LT program by incorporating the fuse coordinate calculation program into a semiconductor-memory-device-independent, fixed-form program that is supplied from the common program database 12. Since an LT program can be generated automatically in the above described manner, there can be provided an apparatus and method for generating, in a case where IC chips incorporating the same memory core are used, a laser trimming program without causing errors as would otherwise occur unavoidably when a program is developed by human hands in a time that does not depend on experiences etc. of a person who generates a program. A recording medium on which a program for execution of such a method is recorded and a laser trimming apparatus using such a laser trimming program can also be provided.

In the laser trimming program generation apparatus, the memory core location parameters that are input through the parameter input means may further include offset information indicating an offset between coordinate origins of the memory core and the IC chip incorporating the memory core, and wherein the fuse coordinate calculation program generating means generates a fuse coordinate calculation program depending on the IC chip of a laser trimming program by correcting, by using the offset information, the fuse coordinate calculation program that has been generated based on the fuse coordinate calculation program corresponding to the memory core that has been selected by the selecting means and the memory core location parameters of the memory core in the IC chip that have been input through the parameter input means.

Here, the laser trimming program generation apparatus may further comprise a laser trimming program recording section for recording the laser trimming program that has been generated by the laser trimming program generating means.

In the laser trimming program generation method, the memory core location parameters that are input in the parameter input step may further include offset information indicating an offset between coordinate origins of the memory core and the IC chip incorporating the memory core, and wherein the fuse coordinate calculation program generating step generates a fuse coordinate calculation program depending on the IC chip of a laser trimming program by correcting, by using the offset information, the fuse coordinate calculation program that has been generated based on the fuse coordinate calculation program corresponding to the memory core that has been selected in the selecting step and the memory core location parameters of the memory core in the IC chip that have been input in the parameter input step.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 2000-261330 filed on Aug. 30, 2000 including specification, claims, drawings and summary are incorporated herein by reference in its entirety.

What is claimed is:

1. A laser trimming program generation method for generating a laser trimming program by using a common program recording section in which an IC-chip-independent common program of a program for laser trimming for cutting fuses corresponding to an address of a defective memory cell of a memory core that is incorporated in an IC chip and used for recording of information in replacing the defective memory cell with a redundant memory cell is recorded, and a coordinate calculation program recording section in which fuse coordinate calculation programs for determining coordinates of fuses to be cut are recorded on a memory core basis, comprising the steps of:

a parameter input step of inputting memory core location parameters including type information indicating a type of a memory core and location-in-IC-chip information indicating a location of the memory core in an IC chip;

a selecting step of selecting a fuse coordinate calculation program corresponding to the memory core from the fuse coordinate calculation programs recorded in the coordinate calculation program recording section based on the type information of the memory core that has been input in said parameter input step;

a fuse coordinate calculation program generating step of generating a fuse coordinate calculation program dependent on the IC chip of a laser trimming program based on the fuse coordinate calculation program corresponding to the memory core that has been selected in said selecting step and the memory core location parameters that have been input in said parameter input step; and a laser trimming program generating step of generating a laser trimming program by incorporating the fuse coordinate calculation program that has been generated in said fuse coordinate calculation program generating step into the common program recorded in the common program recording section.

2. The laser trimming program generation method according to claim 1, the memory core location parameters that are input in said parameter input step further include offset information indicating an offset between coordinate origins of the memory core and the IC chip incorporating the memory core, and wherein said fuse coordinate calculation program generating step generates a fuse coordinate calculation program depending on the IC chip of a laser trimming program by correcting, by using the offset information, the fuse coordinate calculation program that has been generated based on the fuse coordinate calculation program corresponding to the memory core that has been selected in said selecting step and the memory core location parameters of the memory core in the IC chip that have been input in said parameter input step.

* * * * *